United States Patent
Sawahata

(10) Patent No.: US 6,624,479 B2
(45) Date of Patent: Sep. 23, 2003

(54) SEMICONDUCTOR DEVICE HAVING A PROTECTIVE CIRCUIT

(75) Inventor: Koichi Sawahata, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 85 days.

(21) Appl. No.: 09/837,823

(22) Filed: Apr. 18, 2001

(65) Prior Publication Data

US 2001/0033003 A1 Oct. 25, 2001

(30) Foreign Application Priority Data

Apr. 19, 2000 (JP) ........................................ 2000-118274

(51) Int. Cl.[7] ............................................... H01L 23/62
(52) U.S. Cl. ........................ 257/355; 257/357; 257/360
(58) Field of Search ................................. 257/355, 357, 257/360; 361/56, 111

(56) References Cited

U.S. PATENT DOCUMENTS

| | | | | |
|---|---|---|---|---|
| 4,819,047 A | * | 4/1989 | Gilfeather et al. | 257/357 |
| 4,924,339 A | * | 5/1990 | Atsumi et al. | 361/56 |
| 5,751,525 A | * | 5/1998 | Olney | 361/56 |
| 5,978,192 A | * | 11/1999 | Young et al. | 361/56 |
| 6,072,682 A | * | 6/2000 | Ravanelli et al. | 361/111 |
| 6,081,015 A | * | 6/2000 | Kamimura | 257/360 |

FOREIGN PATENT DOCUMENTS

| | | |
|---|---|---|
| JP | 5-347409 | 12/1993 |
| TW | 217467 | 12/1993 |

* cited by examiner

Primary Examiner—Vu A. Le
Assistant Examiner—Doug Menz
(74) Attorney, Agent, or Firm—Choate, Hall & Stewart

(57) ABSTRACT

A protective circuit in a semiconductor device includes a protective n-channel MOS transistor connected between the power source line and the ground line, with the gate and drain being connected together, and an n-p-n transistor having a base connected to the source of the protective n-channel MOS transistor and connected between the power source line and the ground line. The protective circuit disposed in a low-voltage semiconductor device has a lower power dissipation due to a low junction leakage current.

5 Claims, 7 Drawing Sheets

SEMICONDUCTOR DEVICE HAVING A PROTECTIVE CIRCUIT

BACKGROUND OF THE INVENTION

1. Field of the Invention

The present invention relates to a semiconductor device having a protective circuit and, more particularly, to the structure of a new protective circuit disposed in a semiconductor device for protecting an internal circuit of the semiconductor device.

2. Description of the Related Art

Semiconductor device generally has a protective circuit for protecting the internal circuit of the semiconductor device against an electrostatic destruction caused by electrostatic charge entering from outside through input/output terminals.

FIG. 1 shows a circuit diagram of a conventional semiconductor device including a protective circuit connected between a power source terminal (Vdd terminal) 201 and a ground terminal (Vss terminal) 202 for protecting the semiconductor device.

An internal circuit 208 having a specific function and including a plurality of CMOS transistors is connected via a source line (Vdd line) and a ground line (Vss line) to the Vdd terminal 201 and the Vss terminal 202. A protective circuit 204 is connected between the internal circuit 208 and I/O terminals including the Vdd terminal 201 and the Vss terminal 202 at the location between the I/O terminals and the internal circuit 208. The protective circuit 204 is comprised of an n-channel MOS transistor 211 which is connected between the source line Vdd and the ground line Vss, and a p-channel MOS transistor 221 which is connected between the source line Vdd and the ground line Vss in parallel to the n-channel MOS transistor 211. Gate and source of the n-channel MOS transistor 211 are directly connected to the ground line Vss, and drain thereof is directly connected to the source line Vdd. Gate and source of the p-channel MOS transistor 221 are directly connected to the source line Vdd, and drain thereof is directly connected to the ground line Vss.

When a positive high voltage (for example, a noise voltage having a magnitude that causes electrostatic destruction of MOS transistors in the internal circuit) enters through the Vdd terminal 201, the internal circuit 208 is protected by a sequence of operations of the protective circuit 20a against the postive high voltage. More specifically, the n-channel MOS transistor 211, upon drain-to-source breakdown thereof, assumes a bipolar transistor function thereby to cause a current to flow from the Vdd terminal 201 to the Vss terminal 202. Similarly, the p-channel MOS transistor 221, upon source-to-drain breakdown thereof, assumes a bipolar transistor function thereby to cause a current to flow from the Vdd terminal 201 to the Vss terminal 202.

When a negative high voltage enters through the Vdd terminal 201, both the n-channel MOS transistor 211 and the p-channel MOS transistor 221 function as forward-biased diodes, so as to protect the internal circuit 208 by causing the current due to the negative voltage to flow in the forward direction of the diodes implemented by the MOS transistors.

It is to be noted, however, that the protective circuit 204 of the conventional semiconductor device may fail to function when a positive voltage enters through the Vdd terminal 201, as will be detailed below. Since the destruction voltage of the gate insulation film of the CMOS transistor is generally around 1V/1 nm (10 MV/cm), the gate insulation film having a lower thickness of around 5 nm, as used in the recent semiconductor device, has a destruction voltage of about 5V. When a positive voltage enters through the Vdd terminal, as described above, the source-to-drain breakdown of the MOS transistor triggers the bipolar transistor function.

It is generally difficult, however, to achieve the breakdown voltage which is below 5V in the MOS transistor without causing increase of a leakage current in the MOS transistor. That is, the source-to-drain breakdown voltage is determined by the profile of a p-n junction, and particularly by the impurity concentration and the impurity profile on the lightly-doped side of the p-n junction. Although the source-to-drain breakdown voltage generally decreases if the impurity concentration on the lightly-doped side becomes higher, this is accompanied by an increase in the junction leakage current which flows even when the breakdown voltage is not reached. Therefore, it is not a practical solution to simply decrease the source-to-drain breakdown voltage of the MOS transistors in the protective circuit.

SUMMARY OF THE INVENTION

In view of the above, it is an object of the present invention to provide a protective circuit which operates at a voltage higher than the power source voltage and below the breakdown voltage of the internal circuit, substantially without causing an increase of the junction leakage current in the MOS transistor in the protective circuit.

In one embodiment of the present invention, a semiconductor device includes a first source terminal, a second source terminal, an internal circuit including at least one functional MOS transistor having a specific function, a first source line connecting the first source terminal and the internal circuit, a second source line connecting the second source terminal and the internal circuit, and a protective circuit including a protective MOS transistor having a gate, a source, and a drain directly connected to the gate and the first source line, and a bipolar transistor having an emitter connected to the second source line, a collector connected to the first source line and a base directly connected to the source of the n-channel MOS transistor, the protective MOS transistor having a threshold voltage having an absolute magnitude which is higher than a voltage between the first source line and the second source line.

In accordance with the semiconductor device of the one embodiment of the present invention, if a positive noise voltage having an absolute magnitude higher than the threshold voltage of the protective MOS transistor enters through the first source terminal, the noise voltage turns on the protective MOS transistor, which then turns on the bipolar transistor due to the forward bias of the p-n junction in the bipolar transistor. The turn-on of the bipolar transistor passes a current from the first source line toward the second source line, limiting the voltage applied to the internal circuit.

If a negative noise voltage enters through the first source terminal, the p-n junction between the drain and the well of the protective MOS transistor is forward biased, thereby passing a current from the second source line toward the first source line to limit the voltage applied to the internal circuit.

In the one embodiment of the present invention, the first source line may be either a power source line (higher-voltage source line) or a ground line (lower-voltage source line), and the second source line may be a ground line or a power source line depending on the first source line. The protective MOS transistor is implemented by an n-channel transistor if the first source line is a power source line, and is implemented by a p-channel transistor if the first source line is a ground line. The bipolar transistor is implemented by an n-p-n transistor if the first source line is a power source line, and is implemented by a p-n-p transistor if the first source line is a ground line.

The above and other objects, features and advantages of the present invention will be more apparent from the following description, referring to the accompanying drawings.

DETAILED DESCRIPTION OF THE PREFERRED EMBODIMENTS

Figure 1:
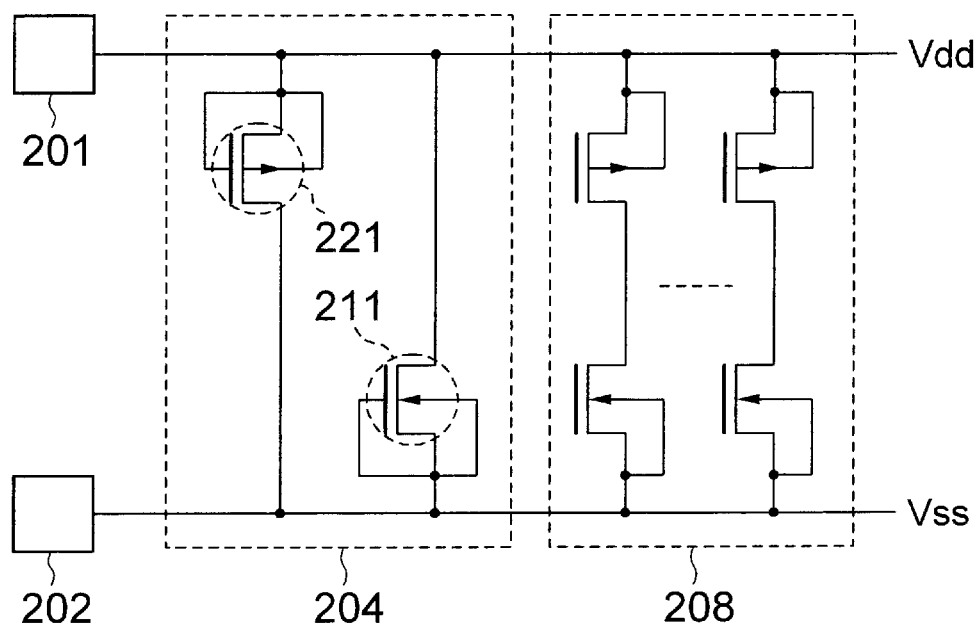
FIG. 1 is a circuit diagram of a conventional semiconductor device including a protective circuit.

Now the present invention will be described below with reference to the accompanying drawings, wherein similar reference numerals designate similar constituent elements.

Figure 2:
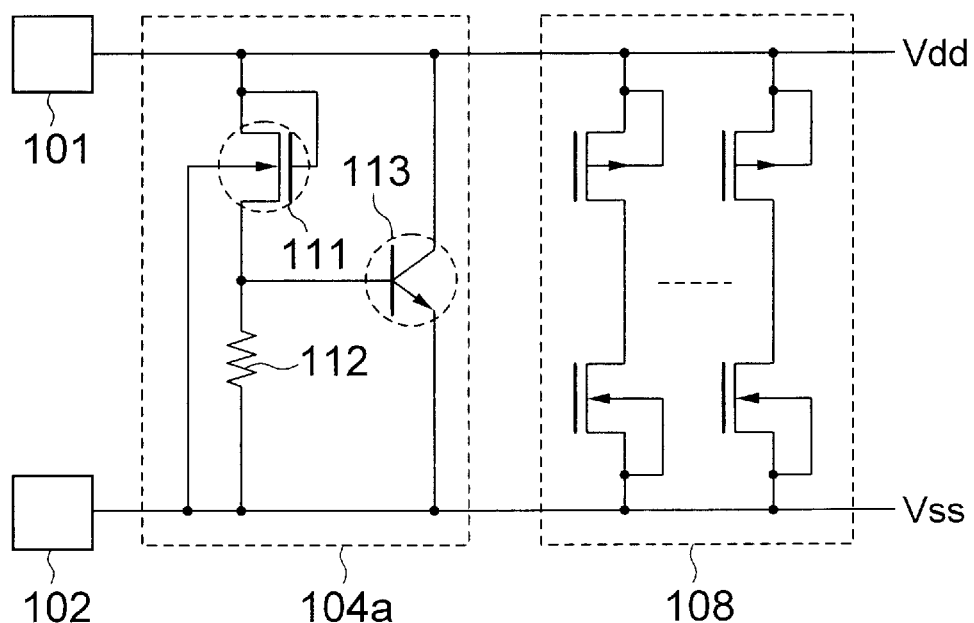
FIG. 2 is a circuit diagram of a semiconductor device according to a first embodiment of the present invention.

Referring to FIG. 2 showing a semiconductor device including a protective circuit according to a first embodiment of the present invention, the semiconductor device includes an internal circuit 108 having a specific function, and a protective circuit 104a for protecting the internal circuit 108 against an electrostatic destruction.

The internal circuit 108 includes a plurality of CMOS transistors and is connected via a source line Vdd and a ground line Vss to a power source terminal (Vdd terminal, or first source terminal) 101 and a ground terminal (Vss terminal, or second source terminal) 102. The protective circuit 104a is disposed between the internal circuit 108, and the Vdd terminal 101 and the Vss terminal 102. The protective circuit 104a includes an n-channel MOS transistor 111 and a resistor element 112 serially connected between the source line Vdd and the ground line Vss and an n-p-n bipolar transistor 113 having a collector and an emitter connected to the source line Vdd and the ground line VSS, respectively. The gate and the drain of the n-channel MOS transistor 111 are connected together and directly connected to the power source line Vdd. The source of the n-channel MOS transistor 111 is connected via the resistor element 112 to the ground line Vss, and is directly connected to the base of the n-p-n transistor 113.

Figure 3A:
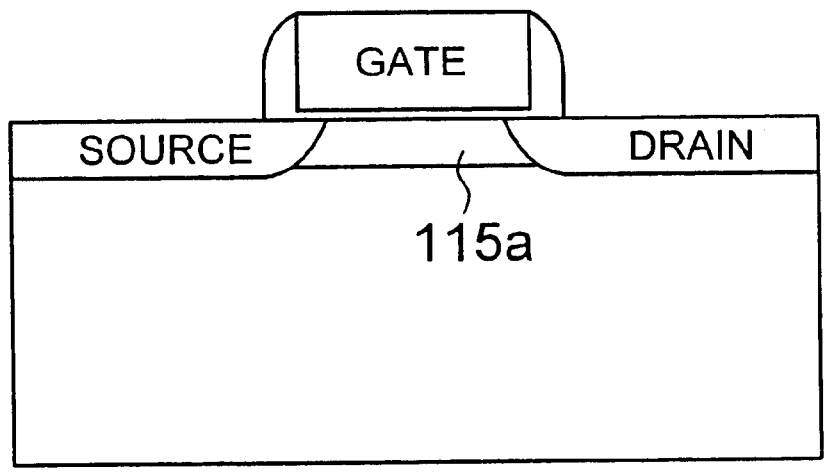
FIGS. 3A and 3B are schematic sectional views of the different structures of the n-channel protective MOS transistor in the semiconductor device shown in FIG. 1.
Figure 3B:
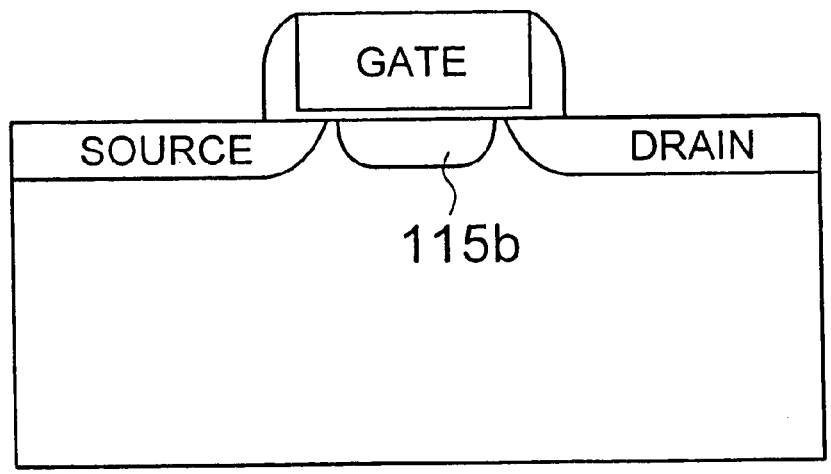

The n-channel MOS transistor 111 is disposed either in a p-well, which is formed on the surface region of a p-type or n-type semiconductor substrate, or in the surface region of a p-type semiconductor substrate, which is connected to the ground line. The n-channel MOS transistor 111 has a threshold voltage Vt higher than the power source voltage Vdd and lower than the destruction voltage of the gate insulation film of the CMOS transistors in the internal circuit 108. The gate insulation film of the n-channel MOS transistor 111 has a thickness equal to the thickness of the gate insulation film of the n-channel MOS transistors in the internal circuit 108, and the n-channel MOS transistor 111 is obtained by controlling the impurity concentration in the channel region right below the gate electrode. If the p-type impurity concentration is relatively low in the p-well (or the p-type semiconductor substrate surface) that acts as a channel region, a specified impurity region 115a is provided over the entire channel region in contact with the source and drain regions thereby to set the threshold voltage at a predetermined value, as shown in FIG. 3A. On the other hand, if the p-type impurity concentration is relatively high in the p-well (or the p-type semiconductor substrate surface) that acts as the channel region, a specified impurity region 115b is provided in the channel region separately from the source and the drain regions, as shown in FIG. 3B. The latter structure prevents an increase of the junction leakage current by specifying the threshold voltage at a suitable value.

In the first embodiment, when a noise voltage of positive polarity having a magnitude larger than the power source voltage enters through the Vdd terminal 101, with the Vss terminal 102 being maintained at the ground potential, the noise voltage is applied to the drain region and the gate electrode of the n-channel MOS transistor 111. If the noise voltage is higher than the threshold voltage Vt of the n-channel MOS transistor 111, the n-channel MOS transistor 111 turns on so that a current flows from the drain region to the source region and also flows through the resistor element 112 toward the ground line Vss. At this stage, the p-n junction between the base and the emitter of the n-p-n bipolar transistor 113 is forward biased. As the voltage drop across the resistor element 112 increases, potential at the base of the n-p-n bipolar transistor 113 increases. When the voltage drop exceeds the forward drop voltage Vf (about 0.7V) of the p-n junction, a forward current flows through the p-n junction between the base and the emitter, resulting in that the current due to the noise voltage is drained from the Vdd terminal 101 to the Vss terminal 102. Thus, the noise voltage applied to the internal circuit 108 is suppressed thereby protecting the internal circuit 108. In the present embodiment, the protective circuit 104a performs a protective function for the internal circuit 108 against the noise voltage which is higher than the power source voltage and below the breakdown voltage of the internal circuit 108, substantially without increasing the junction leakage current.

When the noise voltage applied to the Vdd terminal 101 has a negative polarity (i.e., is lower than the ground potential), the p-n junction between the p-well (or the p-type semiconductor substrate) and the drain of the n-channel MOS transistor 111 is forward biased. In this case, a forward current flowing through the forward-biased p-n junction of the protective circuit 104a suppresses the noise voltage thereby protecting the internal circuit 108 against the noise voltage.

In the first embodiment, it is necessary to make the n-channel MOS transistor 111 not to operate upon application of the power source voltage, and for this reason, the threshold voltage Vt of the n-channel MOS transistor 111 is set higher than the power source voltage Vdd. If the threshold voltage Vt is set lower than the power source voltage Vdd, the n-channel MOS transistor 111 becomes normally on thereby causing the protective circuit itself to be destroyed or the power consumption by the semiconductor device to increase during the normal operation.

Figure 4:
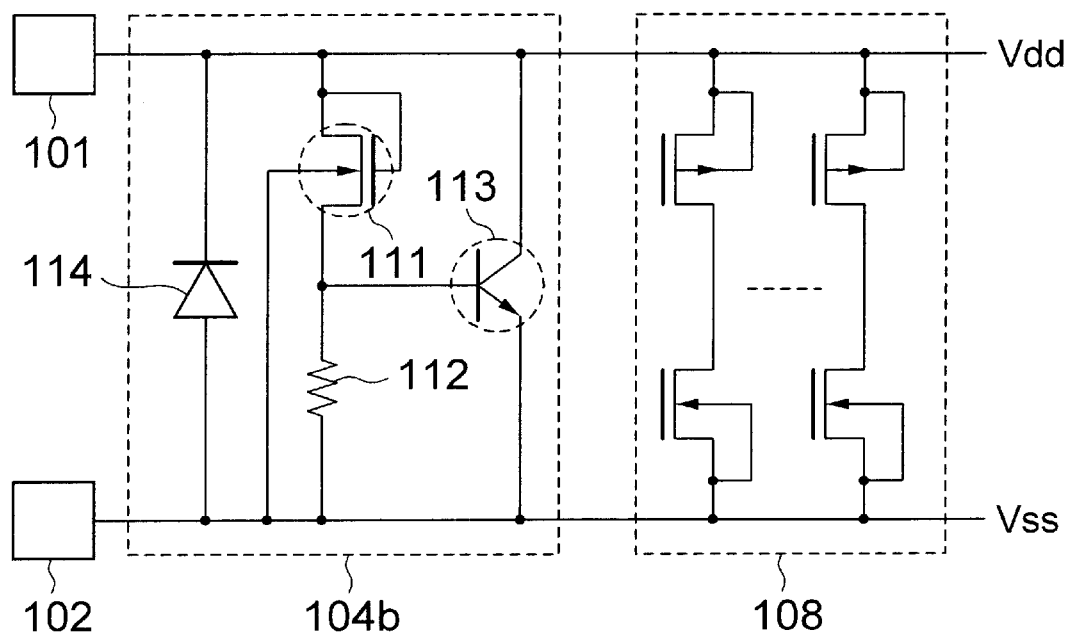
FIG. 4 is a circuit diagram of a semiconductor device according to a second embodiment of the present invention.

Referring to FIG. 4, a semiconductor device according to a second embodiment of the present invention is similar to the first embodiment except that the protective circuit 104b includes a diode 114 in the present embodiment.

The diode 114 is directly connected to the source line Vdd and the ground line Vss in parallel to the n-p-n bipolar transistor 113, and is reverse-biased under the normal condition.

The protective circuit 104b of the second embodiment achieves an advantage similar to that of the protective circuit 104a of the first embodiment. In addition, when a negative noise voltage enters through the Vdd terminal 101, the protective circuit 104b has a larger capability to drive the forward current compared to the protective circuit 104a of the first embodiment.

Figure 5:
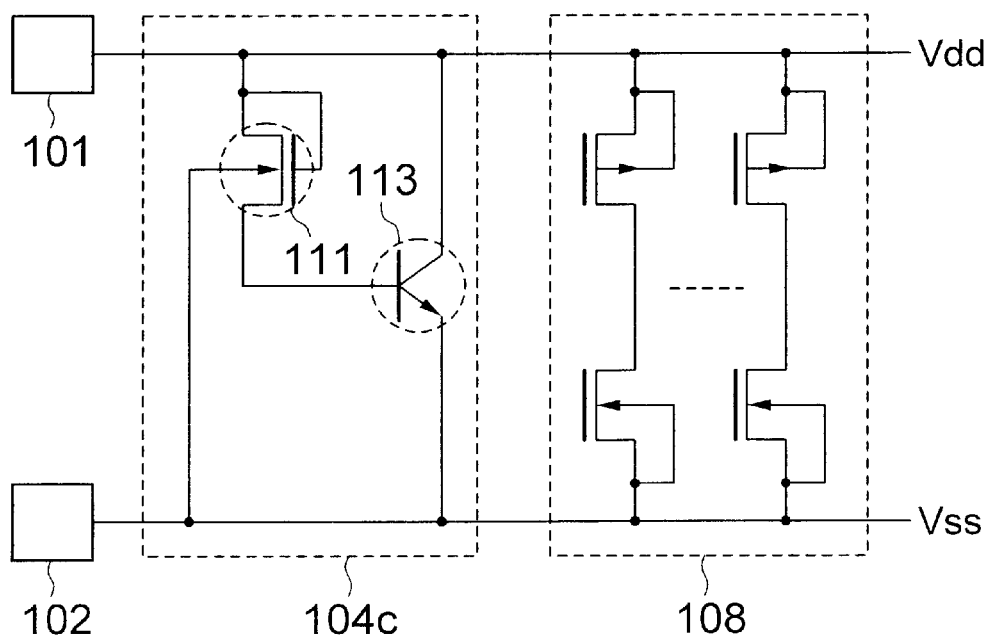
FIG. 5 is a circuit diagram of a semiconductor device according to a third embodiment of the present invention.

Referring to FIG. 5, a semiconductor device according to a third embodiment of the present invention includes a protective circuit 104c similar to the protective circuit 104a of the first embodiment except for the resistor element 112 being omitted in the third embodiment.

In the third embodiment, when a noise voltage higher than the power source voltage enters through the Vdd terminal 101, the n-channel MOS transistor 111 turns on similarly to the first embodiment. Since the resistor element 112 is not provided in the third embodiment, the noise voltage is directly applied to the base of the n-p-n bipolar transistor 113, thereby raising the base potential thereof. Then, a current flows between the collector and the emitter of the n-p-n bipolar transistor 113, thereby protecting the internal circuit 108 against the noise voltage.

Figure 6:
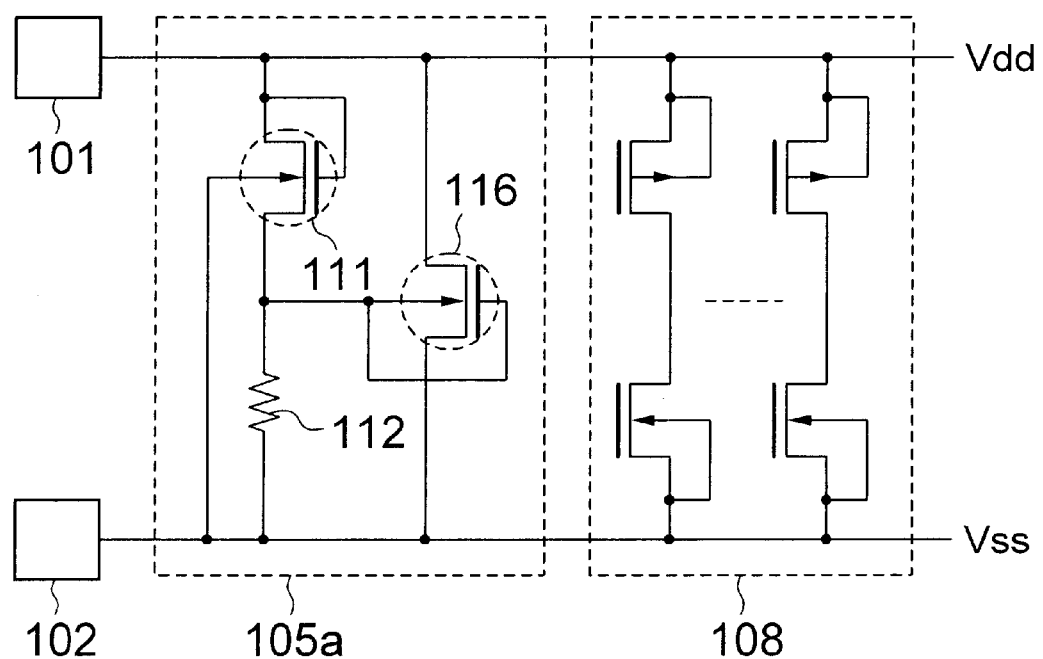
FIG. 6 is a circuit diagram of a semiconductor device according to a fourth embodiment of the present invention.

Referring to FIG. 6, a semiconductor device according to a fourth embodiment of the present invention is similar to the semiconductor device shown in FIG. 2 except that the n-p-n bipolar transistor 113 is replaced by another (second) n-channel MOS transistor 116 in the protective circuit 105a of the present embodiment.

Specifically, the internal circuit 108 including a plurality of CMOS transistors is connected via the power source line Vdd and the ground line Vss to the power source terminal (Vdd terminal) 101 and the ground terminal (Vss terminal) 102. The protective circuit 105a is disposed between the internal circuit 108, and the Vdd terminal 101 and the Vss terminal 102. The protective circuit 105a is comprised of a first n-channel MOS transistor 111 having a gate and drain directly connected to the power source line Vdd and a source connected to the ground line Vss through a resistor element 112, the second n-channel MOS transistor having a drain and a source directly connected to the power source line Vdd and the ground line Vss, respectively. The gate and the p-well of the second n-channel MOS transistor 116 are connected to the source of the first n-channel MOS transistor 111. The first n-channel MOS transistor 111 has a predetermined threshold voltage Vt higher than the power source voltage.

Figure 7:
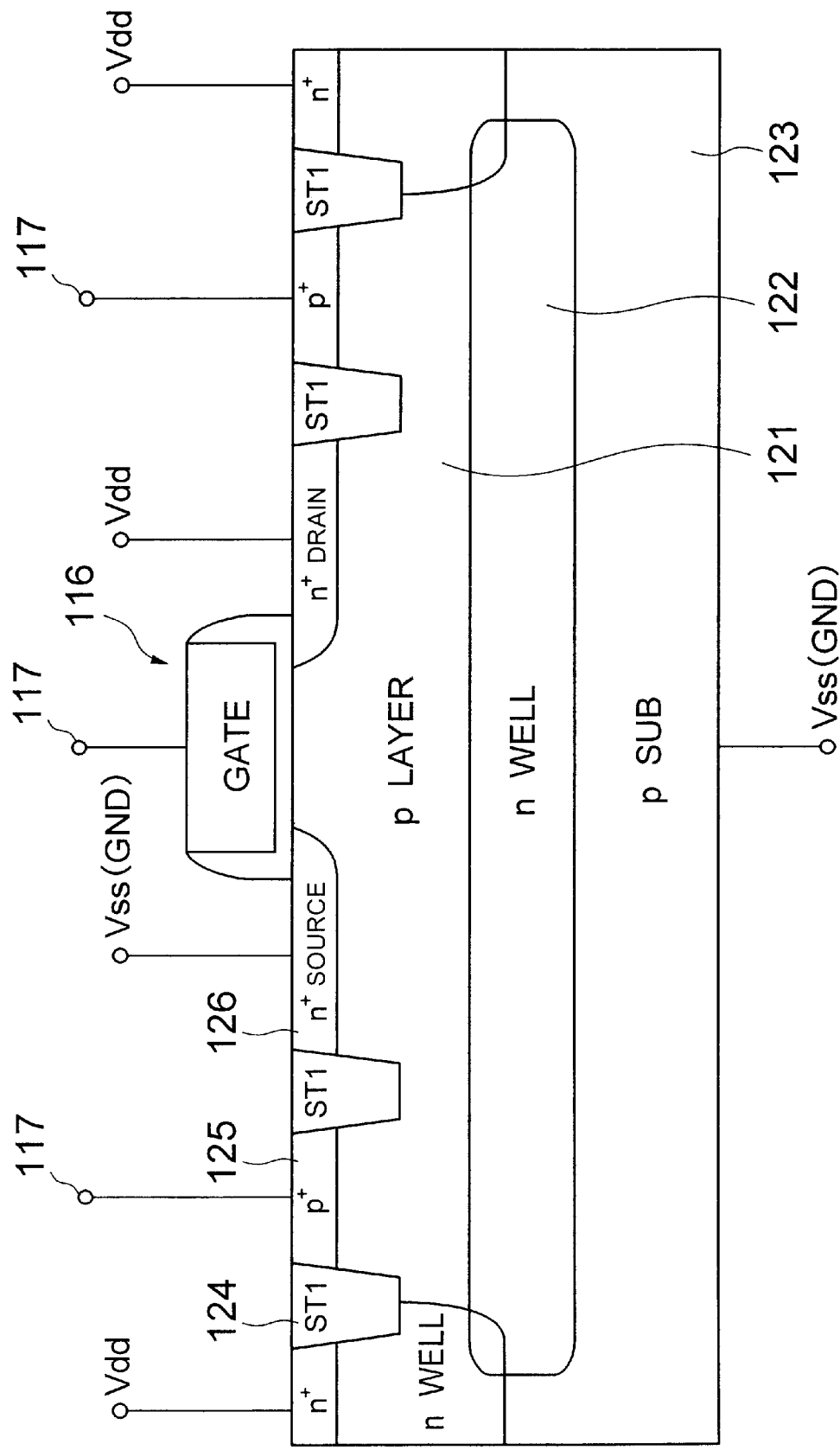
FIG. 7 is a schematic sectional view of the structure of the second protective MOS transistor in the semiconductor device shown in FIG. 6.

Referring to FIG. 7, the second n-channel MOS transistor 116 is disposed in the surface region of a p-well 121 formed on a deep n-well 122, which is formed within the p-type semiconductor substrate 123. In this structure, the p-well 121 of the second n-channel MOS transistor 116 is electrically isolated from the p-type semiconductor substrate 123, and also isolated by shallow isolation trenches 124 from the first MOS transistor 111. External terminals 117 are connected to the gate and a heavily doped p+-type region 125 of the second n-channel MOS transistor 116, the heavily doped p+-type region 125 being formed on the p-well 123. An n+-type region 126 provided on the p-well 123 is connected to the ground line Vss.

The gate and the drain of the first n-channel MOS transistor 111 are connected directly to the source line Vdd. The source of the n-channel MOS transistor 111 is connected via the resistor element 112 to the power source line Vdd, and is further connected through the external terminal 117 to the gate and the p-well 121 of the first n-channel MOS transistor 116. The substrate region (or another p-well region) receiving therein the source and the drain of the first n-channel MOS transistor 111 is connected to the ground line.

When a positive noise voltage enters through the Vdd terminal 101, similarly to the first embodiment, a current flows through the n-channel MOS transistor 111 and the resistor element 112 thereby raising the potential of the gate of the second n-channel MOS transistor 116 and the p-well 121 that constitutes the channel region thereof. When a voltage drop across the resistor element 112 reaches about 0.7 volts, the second n-channel MOS transistor 116 operating as a parasitic bipolar transistor turns on, with a current flowing between the source and the drain thereof, thereby limiting the potential of the power source line. Thus, it is possible to protect the internal circuit 108 against the noise voltage.

In the fourth embodiment of the present invention, similarly to the second embodiment, a diode may be added to the protective circuit 105a.

Figure 8:
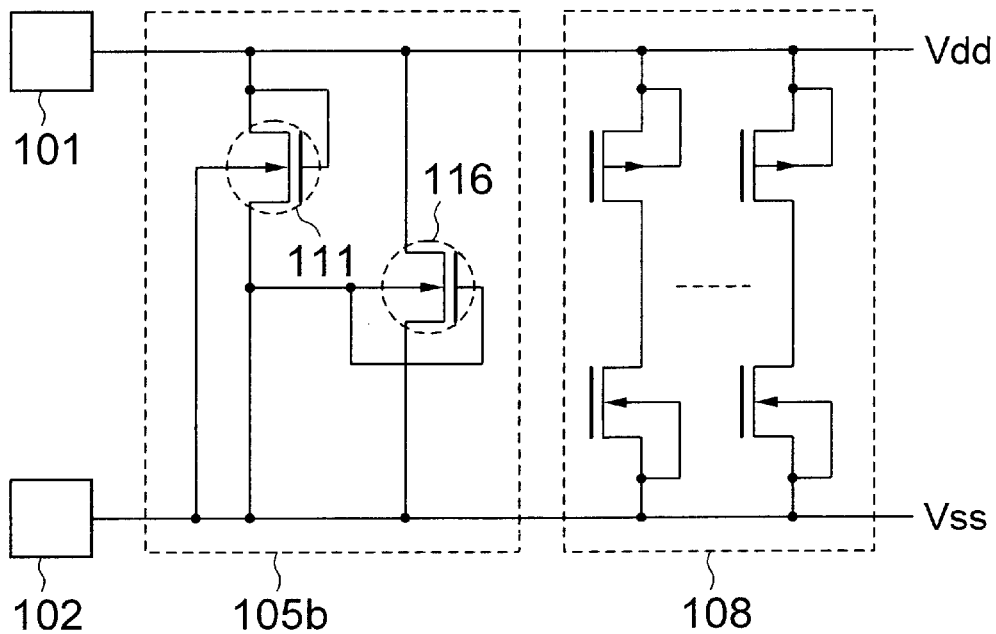
FIG. 8 is a circuit diagram of a semiconductor device according to a fifth embodiment of the present invention.

Referring to FIG. 8, a fifth embodiment of the present invention is such that the protective circuit 105b corresponds to the protective circuit 104c of the third embodiment except that the n-p-n bipolar transistor 113 in FIG. 5 is replaced by the n-channel MOS transistor 116 in the present embodiment, which is disposed on a p-well formed on a deep n-well, such as those shown in FIG. 7.

In the fifth embodiment of the present invention, when a noise voltage higher than the power source voltage enters through the Vdd terminal 101, the first n-channel MOS transistor 111 turns on similarly to the first embodiment. The noise voltage is directly applied to the gate of the second n-channel MOS transistor 116 and to the p-well that constitutes the channel region, thereby increasing the gate potential and the back bias of the second n-channel MOS transistor 116. When the voltage drop reaches about 0.7V, the second n-channel MOS transistor 116 operating as a parasitic bipolar transistor turns on, with a current flowing between the drain and the source thereof, thereby protecting the internal circuit 108.

Figure 9:
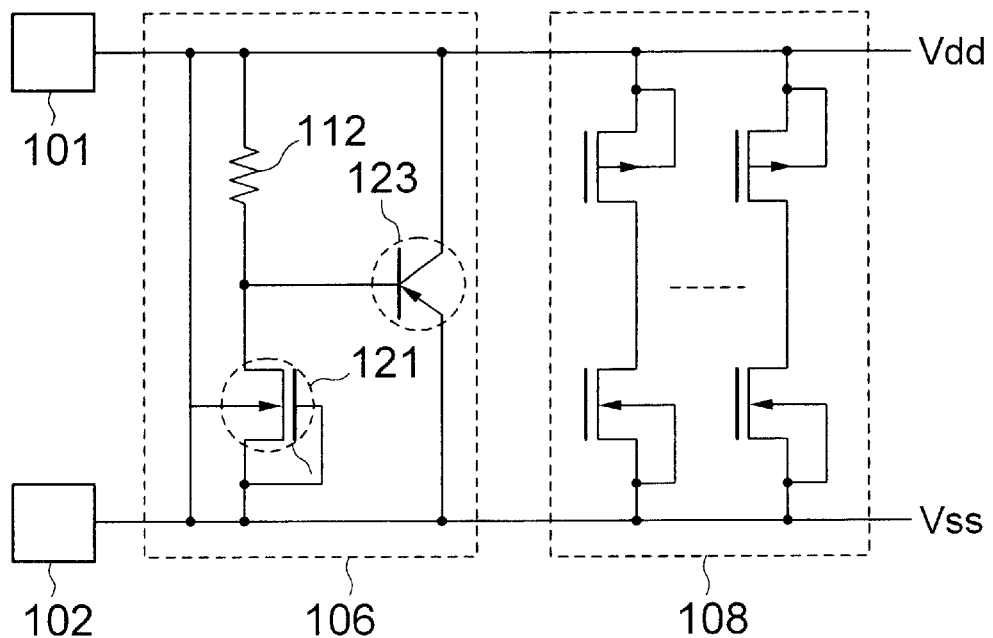
FIG. 9 is a circuit diagram of a semiconductor device according to sixth embodiment of the present invention.

Referring to FIG. 9, a sixth embodiment of the present invention is similar to the embodiment of FIG. 6 except that the n-channel MOS transistor 111 and the n-p-n transistor in FIG. 6 are replaced by a p-channel MOS transistor 121 and a p-n-p transistor 123 in the present embodiment.

More specifically, the internal circuit 108 is connected, via the source line Vdd and the ground line Vss, to the Vdd terminal 101 and the Vss terminal 102. A protective circuit 106 is disposed between the internal circuit 108, and the Vdd terminal 101 and the Vss terminal 102. The protective circuit 106 is comprised of the p-channel MOS transistor 121, the resistor element 112 and the p-n-p bipolar transistor 123 having collector and emitter directly connected to the source line Vdd and the ground line Vss, respectively. Gate and drain of the p-channel MOS transistor 121 are connected directly to the ground line Vss. Source of the p-channel MOS transistor 121 is connected to the source line Vss via the resistor element 112, and is further directly connected to the base of the p-n-p bipolar transistor 123.

The protective p-channel MOS transistor 121 is disposed in the surface region of an n-well, which is formed on a p-type semiconductor substrate and maintained at the power source potential Vdd. The absolute value of the threshold voltage Vt of the p-channel MOS transistor 121 is set higher than the power source voltage Vdd and lower than the destruction voltage of the gate insulation film of the CMOS transistors that constitute the internal circuit 108. The gate insulation film of the p-channel MOS transistor 121 has a thickness equal to that of the gate insulation films of the p-channel MOS transistors in the internal circuit 108. The p-channel MOS transistor 121 is obtained by controlling the impurity concentration in the channel region right below the gate, similarly to the cases of the n-channel MOS transistors 111 of the fourth and fifth embodiments of the present invention.

If the n-type impurity concentration is relatively low in the n-well layer that acts as a channel region, n-type impurities are implanted in the entire channel region thereby to set the threshold voltage Vt at a predetermined value. If the n-type impurity concentration is relatively high in the n-well that acts as the channel region, p-type impurities are implanted in the channel region at the location which is separated from the source and the drain of the p-channel MOS transistor thereby to set the threshold voltage Vt at a predetermined value. The latter structure reduces the junction leakage current.

In the present embodiment, when a positive noise voltage having a magnitude higher than the power source voltage enters through the Vdd terminal 101, with the Vss terminal 102 being biased to the ground potential, a negative voltage having the same magnitude is applied to the drain and the gate of the p-channel MOS transistor 121. If the noise voltage is higher than the absolute value of the threshold voltage or −Vt, the p-channel MOS transistor 121 turns on so that a current flows from the drain thereof to the source and also flows through the resistor element 112. As the voltage drop across the resistor element 112 increases, the potential at the base of the p-n-p bipolar transistor 123 decreases. When the potential of the base of the p-n-p transistor 103 decreases to below the forward voltage drop Vf (about −0.7V) of the p-n junction, a forward current flows between the base and the emitter, as a result of which the current due to the noise voltage is drained from the Vdd terminal 101 toward the Vss terminal 102. Thus, the noise voltage applied to the internal circuit 108 is suppressed thereby protecting the internal circuit 108 against the noise voltage which is higher than the power source voltage and below the destruction voltage of the MOS transistors in the internal circuit 108, without causing the junction leakage current to increase in the protective circuit.

If the noise voltage entering through the Vdd terminal 102 is negative or lower than the ground potential, a forward bias is applied to the p-n junction between the drain and the n-well of the p-channel MOS transistor 121. In this case, the forward current flowing through the p-n junction suppresses the voltage applied in the internal circuit 108, thereby protecting the internal circuit 108 against the noise voltage.

In the sixth embodiment, it is necessary to make the p-channel MOS transistor 121 not to operate upon application of the power source voltage, and for this reason, the absolute value of the threshold voltage Vt of the p-channel MOS transistor is set higher than the power source voltage. If the absolute value of the threshold voltage Vt is set lower than the power source voltage, the p-channel MOS transistor 121 is normally on to be destroyed and/or the power consumption by the semiconductor device increases during the normal operation.

Similarly to the second embodiment, a diode may be added to the protective circuit 106 of the sixth embodiment described above. Further, the resistor element 112 may also be removed from the protective circuit 106 of the present embodiment, similarly to the third embodiment.

The embodiments of the present invention are described in connection with the protective circuits connected between the power source terminal and the ground terminal. However, the protective circuits of the present invention can be provided between a signal terminal (input terminal, output terminal or input/output terminal) and a power source terminal or a ground terminal.

Figure 10A:
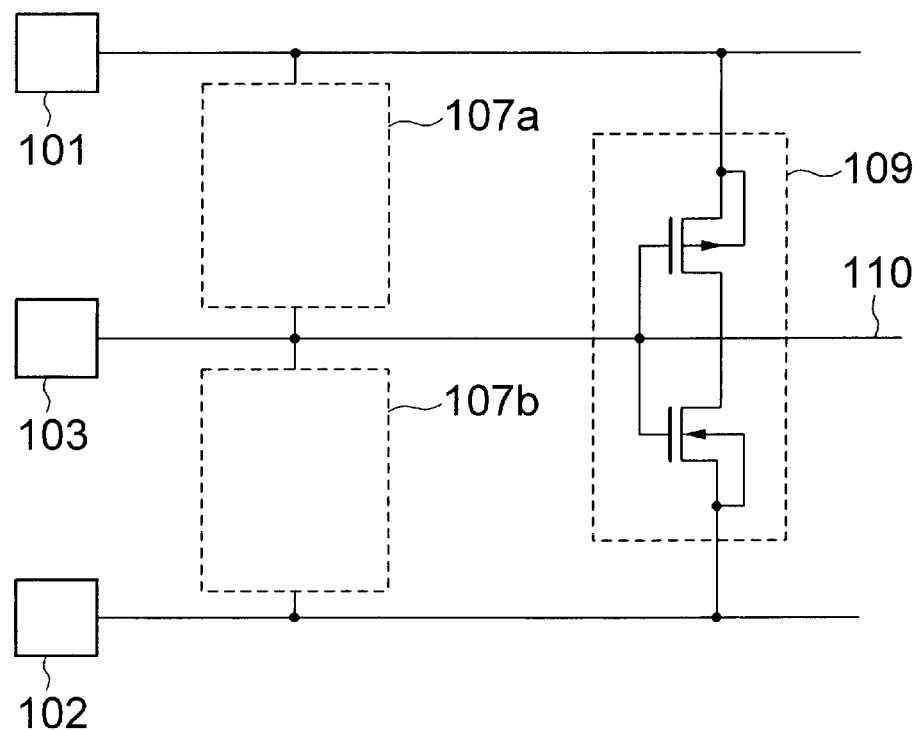
FIGS. 10A and 10B are circuit diagrams of a semiconductor device according to a seventh embodiment of the present invention.

Referring to FIG. 10A, a seventh embodiment of the present invention has protective circuit sections applied between the power source terminal 101 and a signal input terminal 103 and between the ground terminal 102 and the signal input terminal 102.

The gates of MOS transistors of a CMOS inverter in the internal circuit 109 are connected to an input terminal 103, the source of the p-channel MOS transistor of the CMOS inverter is connected via the source line Vdd to the Vdd terminal 101, and the source of an n-channel MOS transistor of the CMOS inverter is connected via the ground line Vss to the Vss terminal 102. A protective circuit section 107a is disposed between the internal circuit 109, and the Vdd terminal 101 and the input terminal 103. Similarly, a protective circuit section 107b is connected between the internal circuit 109, and the input terminal 103 and the Vss terminal 102.

Figure 10B:
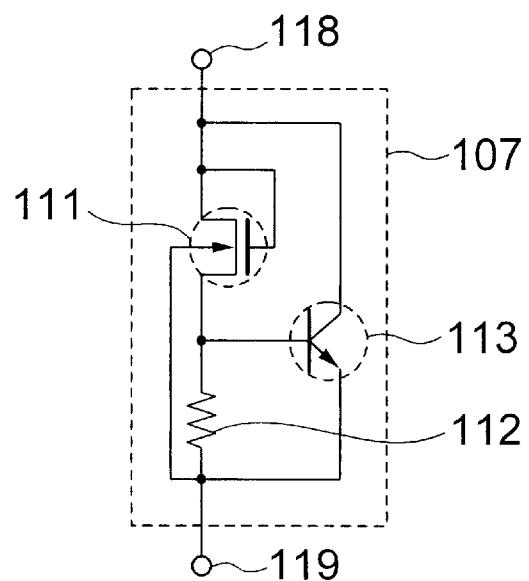

Referring to FIG. 10B, an example of the protective circuit section 107a or 107b is implemented by a protective circuit 107 which is similar to the protective circuit 104a described in connection with the first embodiment of the present invention. In the protective circuit section 107a, the external terminals 118 and 119 of the protective circuit 107 are connected to the power source line and the signal line, respectively. In the protective circuit section 107b, the external terminals 118 and 119 of the protective circuit 107 are connected to the signal line and the ground line, respectively.

The threshold voltage Vt of the n-channel MOS transistor 111 in the protective circuit 107 is set similarly to the case of the first embodiment. As a result, increase in the power consumption during normal operation and other problems are avoided similarly to the first embodiment of the present invention.

If a positive noise voltage having a magnitude higher than the power source voltage enters through the signal input terminal 103, a current due to the noise voltage flows through the protective circuit section 107b from the signal input terminal 103 to the Vss terminal 102, thereby protecting the internal circuit 109. If a negative noise voltage lower than the ground voltage enters through the signal input terminal 103, a current due to the noise voltage flows through the protective circuit section 107a from the signal input terminal 103 to the Vdd terminal 101, thereby protecting the internal circuit 109.

In the seventh embodiment, it is described that the protective circuit section 107a and the protective circuit section 107b are implemented by the protective circuit 107. However, the protective circuit sections 107a and 107b may be implemented by any of the protective circuits of the first through sixth embodiments. Moreover, the protective circuit sections 107a and 107b may have circuit configurations different from one another. Furthermore, the seventh embodiment may be applied to either the signal output terminal or the signal input/output terminal.

As described above, according to the protective circuits of the embodiments of the present invention, an increase in the power consumption in the protective circuit during a normal operation of the semiconductor device is alleviated. If a noise voltage enters through the power source terminal, noise current flows between the power source terminal and the ground terminal via the protective circuit so that the internal circuit is protected.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising:

a first source terminal, a second source terminal, an internal circuit including at least one functional MOS transistor having a specific function, a first source line connecting said first source terminal and said internal circuit, a second source line connecting said second source terminal and said internal circuit, and a protective circuit including a protective MOS transistor having a gate, a source, and a drain directly connected to said gate and said first source line, and a bipolar transistor having an emitter connected to said second source line, a collector connected to said first source line and a base directly connected to said source of said protective MOS transistor, said protective MOS transistor having a threshold voltage having an absolute magnitude which is higher than a voltage between said first source line and said second source line; wherein said source of said protective MOS transistor is connected to said second source line through a resistor element.

2. The semiconductor device as defined in claim 1 further comprising a diode reverse-biased between first source line and said second source line.

3. The semiconductor device as defined in claim 1, wherein said first source line and said second source line are a power source line and a ground line, respectively, and said protective MOS transistor and said bipolar transistor are an n-channel transistor and an n-p-n transistor, respectively.

4. The semiconductor device as defined in claim 1, wherein said first source line and said second source line are a ground line and a power source line, respectively, and said protective MOS transistor and said bipolar transistor are a p-channel transistor and a p-n-p transistor, respectively.

5. The semiconductor device as defined in claim 1, wherein a substrate region or well region receiving therein said source and drain is connected to said second source line.

* * * * *